United States Patent
Sarlashkar et al.

(10) Patent No.: US 11,415,637 B2
(45) Date of Patent: Aug. 16, 2022

(54) SYSTEM AND METHOD FOR ESTIMATING BATTERY STATE OF HEALTH

(71) Applicant: Southwest Research Institute, San Antonio, TX (US)

(72) Inventors: Jayant V. Sarlashkar, San Antonio, TX (US); Mickey E. Argo, Jr., San Antonio, TX (US); Bapiraju Surampudi, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 279 days.

(21) Appl. No.: 16/747,483

(22) Filed: Jan. 20, 2020

(65) Prior Publication Data

US 2021/0223326 A1 Jul. 22, 2021

(51) Int. Cl.
*G01R 31/392* (2019.01)
*G01R 31/385* (2019.01)
*G01R 31/3835* (2019.01)
*G01R 31/28* (2006.01)

(52) U.S. Cl.
CPC ......... *G01R 31/392* (2019.01); *G01R 31/386* (2019.01); *G01R 31/3835* (2019.01); *G01R 31/2874* (2013.01)

(58) Field of Classification Search
CPC .......................... G01R 31/392; G01R 31/3835; G01R 31/386; G01R 31/2874
See application file for complete search history.

(56) References Cited

U.S. PATENT DOCUMENTS

| | | | |
|---|---|---|---|
| 7,239,146 B2 | 7/2007 | James et al. | |
| 7,576,445 B2* | 8/2009 | Hammerschmidt | G05F 1/56 180/282 |
| 8,159,189 B2 | 4/2012 | Zhang | |
| 9,429,628 B2 | 8/2016 | Surampudi et al. | |
| 10,511,050 B1 | 12/2019 | Rahimian et al. | |
| 2012/0158330 A1 | 6/2012 | Araki | |
| 2013/0138369 A1* | 5/2013 | Papana | B60L 58/12 702/63 |
| 2013/0229154 A1 | 9/2013 | Benjamin et al. | |
| 2015/0349385 A1 | 12/2015 | Hu et al. | |
| 2016/0248126 A1 | 8/2016 | Wang | |
| 2017/0038436 A1* | 2/2017 | Montaru | G01R 31/392 |
| 2018/0059192 A1* | 3/2018 | Seo | G01R 31/392 |
| 2018/0205121 A1 | 7/2018 | Chiang et al. | |
| 2018/0292460 A1 | 10/2018 | Neelam et al. | |

OTHER PUBLICATIONS

International Search Report and Written Opinion dated Mar. 25, 2021, issued in PCT International Patent Application No. PCT/US2021/014094, 9 pages.

* cited by examiner

*Primary Examiner* — Nha T Nguyen
(74) *Attorney, Agent, or Firm* — Grossman, Tucker, Perreault & Pfleger, PLLC

(57) ABSTRACT

A system and method for providing an application-independent estimation of the state of health (SOH) of a battery. A battery terminal voltage, under a non-zero load, when a specific amount of charge has been drawn from the battery is compared to stored terminal voltage test data obtained under the same conditions. An estimate of SOH is provided in response to the comparison.

19 Claims, 4 Drawing Sheets

SYSTEM AND METHOD FOR ESTIMATING BATTERY STATE OF HEALTH

TECHNICAL FIELD

The present application relates to generally to batteries and, more particularly, to a system and method for estimating the state of health of a battery.

BACKGROUND

Batteries, including lithium-ion batteries, may be used for a variety of target applications that require relatively high levels of energy storage, power delivery and recharge cycle capability. These applications may include, for example, hybrid electric vehicles (HEVs), plug-in hybrid electric vehicles (PHEVs), battery electric vehicles (BEVs), and portable electronic devices such as laptop computers, cell phones, power tools, medical equipment, etc. Parties, ranging from manufacturers to end users of these batteries, have an interest in monitoring the ability of a battery to store and deliver electrical energy, which is known to degrade with use and over time.

In a lithium-ion battery, for example, performance degradation may be caused by a variety of factors, including growth of a solid electrolyte interphase (SEI) layer at the anode, loss of active material at the cathode, loss of conductive paths within the anode/cathode, lithium plating (irreversible and reversible), and oxidation of the electrolyte in the battery. In the case of growth of the SEI layer, the layer reduces diffusivity of lithium causing increased anode resistance and decreased high-rate capacity. The battery fails to perform when the diffusion rate of lithium cannot support the required rate of withdrawal from the anode. Unfortunately, although a battery may appear to be operational, failure of the battery may be imminent. There has thus been a long-standing need to estimate the state of health (SOH) of a battery.

In general, battery SOH is not an absolute measurement but is instead a metric that reflects the general condition of a battery and its ability to deliver the specified performance compared with a new battery. There is no single accepted definition of the SOH. Instead, it is a subjective measure in that may be derived from a variety of different measurable battery performance parameters interpreted according to a selected set of rules. Often, however, SOH is identified as a percentage of the performance capability of a new battery. Using this approach, a battery will have a SOH of 100% at the time of manufacture and the SOH will decrease over time and use. In some instances, a battery with a specific SOH, e.g. 50% or 80%, may be considered in jeopardy of imminent failure.

Some known SOH estimators are application-dependent (e.g. limited to a specific drive or duty cycle) and rely on data-driven statistical model(s) of battery aging. Unfortunately, these estimators are not particularly useful outside of their specific application and/or statistical models. What is needed, therefore, are improved methods and systems for estimating the SOH of a battery that are application-independent.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
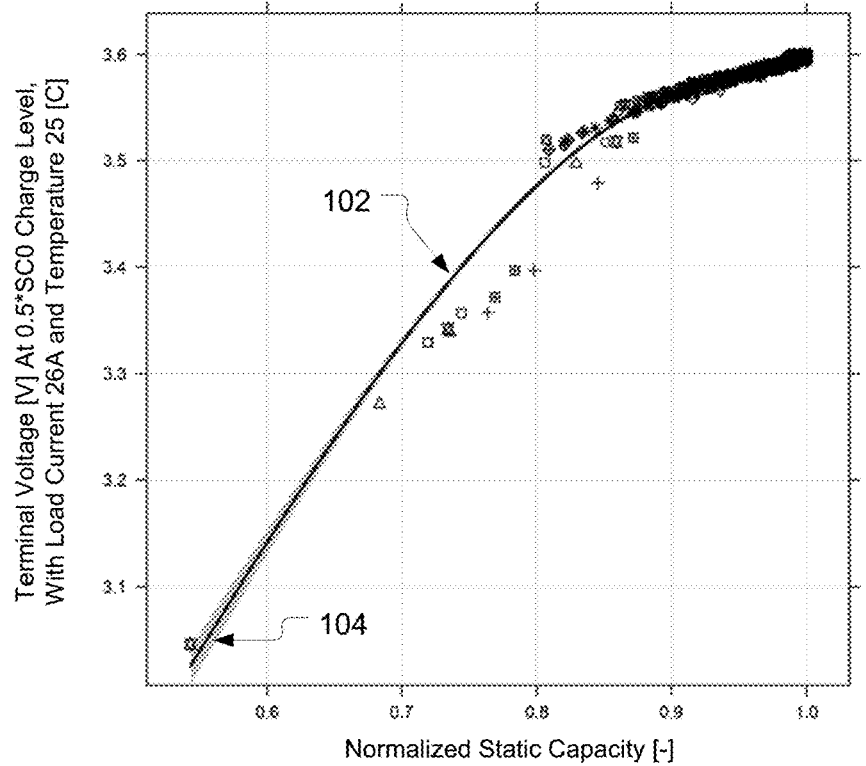
FIG. 1 is a plot of terminal voltage vs. normalized static capacity representing one example of terminal voltage test data useful in a system and method consistent with the present disclosure.

It may be appreciated that the present disclosure is not limited in its application to the details of construction and the arrangement of components set forth in the following description or illustrated in the drawings. The examples described herein may be capable of other embodiments and of being practiced or being carried out in various ways. Also, it may be appreciated that the phraseology and terminology used herein is for the purpose of description and should not be regarded as limiting as such may be understood by one of skill in the art. Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

Various example embodiments of a system and method consistent with the present disclosure will be described herein using commonly used battery terminology. For example, as used herein the term:

"battery" means an electrochemical device used to store energy, which may be a single battery cell or a group of two or more electrically connected battery cells;

"cell" means an electromechanical device used to store energy comprising of positive and negative plates and an electrolyte;

"battery terminals" means the parts of a battery to which an electric circuit is connected;

"terminal voltage" means the voltage between the battery terminals;

"static capacity" (SC) means the total amp-hours (Ah) available when a fully charged battery is discharged at a certain discharge current from a 100 percent state-of-charge (SoC) to a cut-off voltage;

"amp-hours" (Ah) means current in amperes (A) multiplied by time in hours (h), e.g. one amp-hour is equal to a current of one ampere flowing for one hour, 26 Ah is equal to a current of 26 amperes flowing for one hour, etc.;

"full charge" or "fully charged" means when the charge current drops to a predetermined set level, e.g. 3-5% of a rated current of the battery;

"state of charge" (SoC) or "charge level" means the level of charge of a battery expressed as a percentage of its maximum or rated charge;

"cut-off voltage" means a minimum allowable voltage of a battery and defines an empty state of the battery; and "static capacity at the beginning of life" (SC0) means the static capacity of a new battery and is specified by battery manufacturer.

The present disclosure relates to application-independent estimation of battery SOH. In general, a system and method consistent with the present disclosure, provides an indication of battery SOH by determining a battery terminal voltage, under a non-zero load, when a specific amount of charge (measured in ampere-hour) has been drawn from the battery and comparing the battery terminal voltage to stored terminal voltage test data. Advantageously, battery terminal voltage is an intrinsic property of the battery, and it has been found that in a system and method consistent with the present disclosure, the battery terminal voltage provides useful surrogate for the static capacity of the battery, and thus also a surrogate for SOH. Being an intrinsic property of a battery, the battery terminal voltage is independent of the specific situation or conditions in which the battery is used and a system and method consistent with the present disclosure is thus also independent of the battery application.

Figure 2:
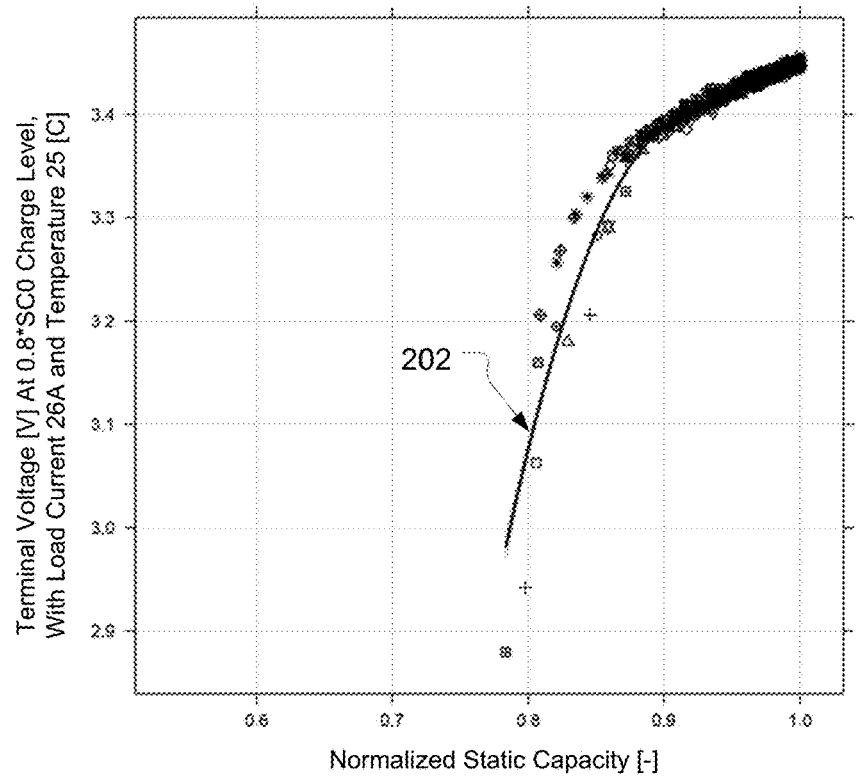
FIG. 2 is a plot of terminal voltage vs. normalized static capacity representing another example of terminal voltage test data useful in a system and method consistent with the present disclosure.

The relationship between battery terminal voltage and static capacity, and therefore SOH, may be understood, for example, with reference to FIGS. 1-4. FIGS. 1 and 2 each illustrate performance of two different samples of nominally the same known 26 Ah lithium nickel manganese cobalt oxide (NMC) battery cell. FIG. 1 includes a trendline plot 102 of battery terminal voltage after 0.5*SC0 (fifty percent of the beginning-of-life static capacity) has been drawn from the battery samples, the battery samples are at a temperature of 25° C. and the battery samples are under non-zero load with a load current of 26 A vs. normalized static capacity of the battery. FIG. 2 includes a trendline plot 202 of battery terminal voltage after 0.8*SC0 (eighty percent of the beginning-of-life static capacity) has been drawn from the battery samples, the battery samples are at a temperature of 25° C. and the battery samples are under non-zero load with a load current of 26 A vs. normalized static capacity of the battery.

Figure 3:
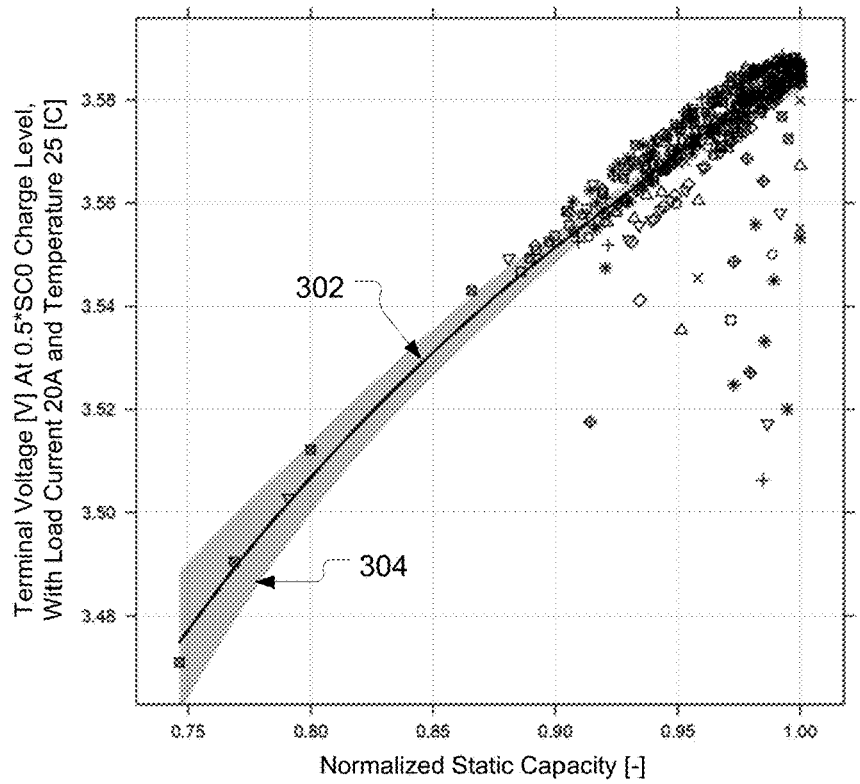
FIG. 3 is a plot of terminal voltage vs. normalized static capacity representing another example of terminal voltage test data useful in a system and method consistent with the present disclosure.
Figure 4:
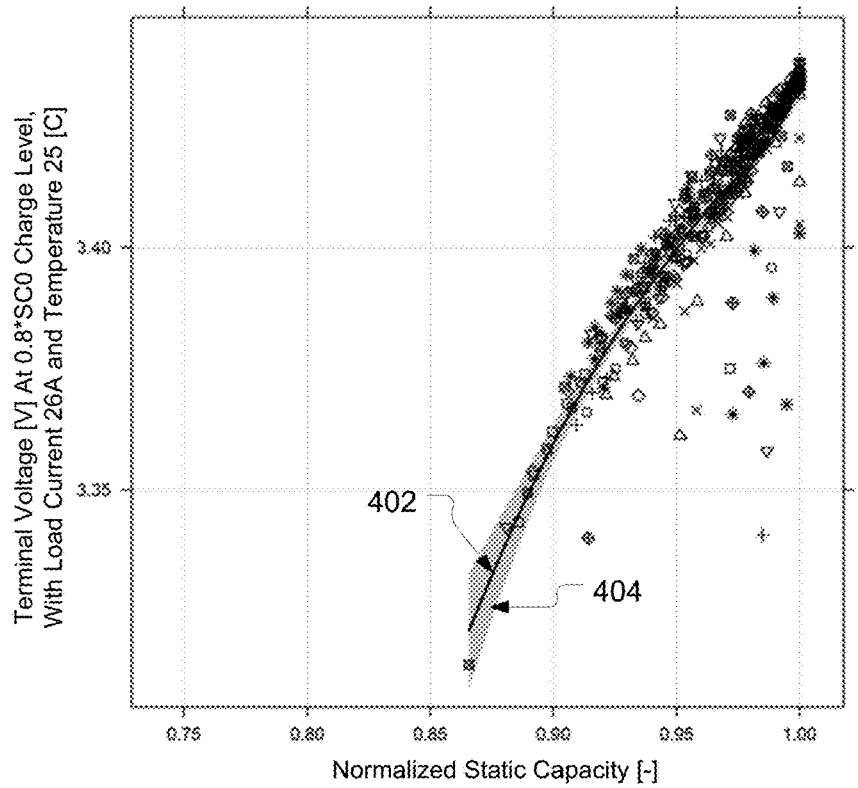
FIG. 4 is a plot of terminal voltage vs. normalized static capacity representing another example of terminal voltage test data useful in a system and method consistent with the present disclosure.

FIGS. 3 and 4 each illustrate performance of a two different samples of nominally the same known 57 Ah lithium nickel manganese cobalt oxide (NMC) battery cell. FIG. 3 includes a trendline plot 302 of battery terminal voltage after 0.5*SC0 (fifty percent of the beginning-of-life static capacity) has been drawn from the battery samples, the battery samples are at a temperature of 25° C. and the battery samples are under non-zero load with a load current of 20 A vs. normalized static capacity of the battery. FIG. 4 includes a plot 402 of battery terminal voltage after 0.8*SC0 (eighty percent the beginning-of-life static capacity) has been drawn from the battery samples, the battery samples are at a temperature of 25° C. and the battery samples are under non-zero load with a load current of 26 A vs. normalized static capacity of the battery.

The various symbols shown in FIGS. 1-4 identify the measured battery terminal voltage data and static capacity data for different calendar testing conditions and different cycle testing conditions.

Calendar Testing

In calendar testing, the two cell samples were subjected to each of the nine storage temperature (T[° C.]) and state of charge (SOC [%]) conditions (total number of samples 18) shown in Table 1 below.

TABLE 1

| Test | T [° C.] | SOC [%] |
|---|---|---|
| 1 | 25 | 30 |
| 2 | 25 | 50 |
| 3 | 25 | 80 |
| 4 | 45 | 30 |
| 5 | 45 | 50 |
| 6 | 45 | 80 |
| 7 | 55 | 30 |
| 8 | 55 | 50 |
| 9 | 55 | 80 |

For each test condition, the battery samples were subjected to the associated temperature and SOC, placed into storage, and removed from storage after four weeks. After removal from storage, the samples were brought to a temperature of 25° C. and evaluated for static capacity in a static capacity testing portion of a known reference performance test (RPT). The battery terminal voltage was also measured after drawing a specified charge (i.e. 0.5*SC0 for FIGS. 1 and 3 and 0.8*SC0 for FIGS. 2 and 4) from the fully charged sample and with the sample under a specified and fixed current (i.e. 26 A for FIGS. 1, 2 and 4 and 20 A for FIG. 3) to a test load. For each of the test conditions and for each of the samples, the static capacity and battery terminal voltage at the specified discharge level, fixed current and temperature (25° C. in this case) were recorded and are reflected by associated symbols as shown in FIGS. 1-4.

Cycle Testing

In cycle testing, the two cell samples were subjected to each of the nine cycling conditions (total number of samples 18) shown in Table 2 below and continuously cycled at an associated duty cycle.

TABLE 2

| Test | T [° C.] | SOC [%] | Discharge Power [%] | Charge Power [%] |
|---|---|---|---|---|
| 1 | 25 | 20 | 10 | 10 |
| 2 | 25 | 40 | 25 | 25 |
| 3 | 25 | 60 | 40 | 40 |
| 4 | 45 | 20 | 25 | 40 |
| 5 | 45 | 40 | 40 | 10 |
| 6 | 45 | 60 | 10 | 25 |
| 7 | 55 | 20 | 40 | 25 |
| 8 | 55 | 40 | 10 | 40 |
| 9 | 55 | 60 | 25 | 10 |

For each test, cycling was stopped (once every one or two weeks) and the samples were brought to a temperature of 25° C. and evaluated for static capacity in a static capacity testing portion of the known RPT. The battery terminal voltage was also measured after drawing a specified charge (i.e. 0.5*SC0 for FIGS. 1 and 3 and 0.8*SC0 for FIGS. 2 and 4) from the fully charged sample and with the sample a under a specified and fixed current (i.e. 26 A for FIGS. 1, 2 and 4 and 20 A for FIG. 3) to a test load. For each of the tests and for each of the samples, the static capacity and battery terminal voltage at the specified discharge level, fixed current and temperature (25° C. in this case) were recorded and are reflected by associated symbols as shown in FIGS. 1-4.

Trendline

The data indicated by the symbols in each of FIGS. 1-4 unexpectedly follows an associated trendline plot 102, 202, 302, 402 despite the respective cells having been subjected to disparate conditions. The trendline plots 102, 202, 302, 402 were constructed using the LOWESS (locally weighted scatterplot smoothing) method, which is sometimes also known as the Savitzky-Golay filter. The shaded areas 104, 304, 404 around the trendline plots 102, 302 and 404, respectively, represent a range of uncertainty for the plotted data and is derived from prior knowledge of uncertainty using standard Bayesian referencing. The accuracy of the prior knowledge can be improved by increasing data sample sizes.

The data represented by the trendline plots 102, 202, 302, 402 may be tabulated as terminal voltage test data along with data prepared by performing the calendar and cycle testing using with static capacity and battery terminal voltage testing at various temperatures (instead of 25° C.) and at different load currents. The resulting table then implements a three-dimensional function wherein:

Terminal voltage=$f$(SOH,temperature,load current)     (Equation 1)

is inverted to provide an estimation of the battery SOH:

SOH=$g$(Terminal voltage,temperature,load current)     (Equation 2)

This tabulation may be stored, e.g. in a look-up table, as terminal voltage test data and used to provide an estimated state of health for a battery that is nominally the same as the battery used to generate the terminal voltage test data. As used herein, batteries are "nominally the same", for example, when they have the same model number and/or nominal features indicated by a manufacturer.

In some embodiments, after a specific amount of charge is withdrawn from a fully charged battery, the battery terminal voltage may be measured with the battery under non-zero load with a known load current and at a known temperature. The resulting battery terminal voltage may be compared to the stored terminal voltage test data associated with the same level of charge drawn, load current and temperature. In some embodiments, where the battery will operate at a relatively stable expected or controlled temperature, the terminal voltage test data may be determined at that expected temperature and the comparison may be made assuming that temperature is the temperature at which the battery terminal voltage was measured.

For example, a battery used in an electric vehicle may be fully charged and then monitored to determine when a specific amount of charge has been withdrawn from the battery, e.g. resulting from use under various conditions and perhaps recharging by a regenerative brake system or other system. Once the net discharge of the battery reaches the level where the specific amount of charge has been withdrawn, the battery terminal voltage may be measured under a non-zero specified current to the load and temperature. The resulting battery terminal voltage may be compared to the stored terminal voltage test data for nominally the same battery associated with the same level of charge drawn, load current and temperature to correlate the measured battery terminal voltage with an associated level of estimated static capacity. In some embodiments, this can be done by monitoring windows of operation of the battery, e.g. during highway coasting of a vehicle, during sleep mode of an electronic device, etc., so that battery terminal voltage can be measured when the specific amount of charge has been withdrawn from the battery and the battery is supplying the specified current to the load and is at the specified temperature. The estimated level of static capacity may be provided as a signal representative of an estimated SOH of the battery.

With reference to FIG. 1, for example, the battery terminal voltage for a battery that is nominally the same as the battery used to generate the terminal voltage test data in FIG. 1 may be measured under nominally the same conditions as used for the terminal voltage test data in FIG. 1, i.e. after the battery has discharged to fifty percent of its beginning of life static capacity and with the battery delivering 26A to a load with a battery temperature of 25° C. Using the trendline plot 102 in FIG. 1, a measured battery terminal voltage of about 3.51V will indicate that the battery is at about 82%+/−about 1% (as represented by the shaded area around the trendline) of its beginning-of-life static capacity, whereas a battery voltage of about 3.6V will indicate the battery is at about 100% of its beginning-of-life static capacity.

A static capacity of 80% is commonly considered to indicate a battery is nearing, or at, its end-of-life. In some embodiments, a battery terminal voltage threshold associated with an estimated static capacity of about 80% may be stored as a threshold and when a measured battery terminal voltage under the same conditions as used for the data reaches the threshold, a signal representative of the battery SOH may provide a warning that the battery is at, or near, its end-of-life.

Instead of, or in addition to, measuring battery terminal voltage after a specific amount of charge has been withdrawn from the battery and when the battery is providing a known load current and is at a particular temperature, and comparing the terminal voltage to associated terminal voltage test data, a system and method consistent with the present disclosure may be implemented during charging of a battery. For example, after a battery has discharged by an amount greater than a specified charge level, the battery may be fully charged while monitoring and recording the battery temperature and the battery terminal voltage under a non-zero load with a specified load current. The battery terminal voltage and temperature at the specified charge level may then be obtained from data recorded during charging of the battery. The resulting battery terminal voltage may be compared to the stored terminal voltage test data for nominally the same battery associated with the same level of charge drawn, load current and temperature to correlate the measured battery terminal voltage with an associated level of estimated static capacity. The estimated level of static capacity may be provided as a signal representative of an estimated SOH of the battery.

Figure 5:
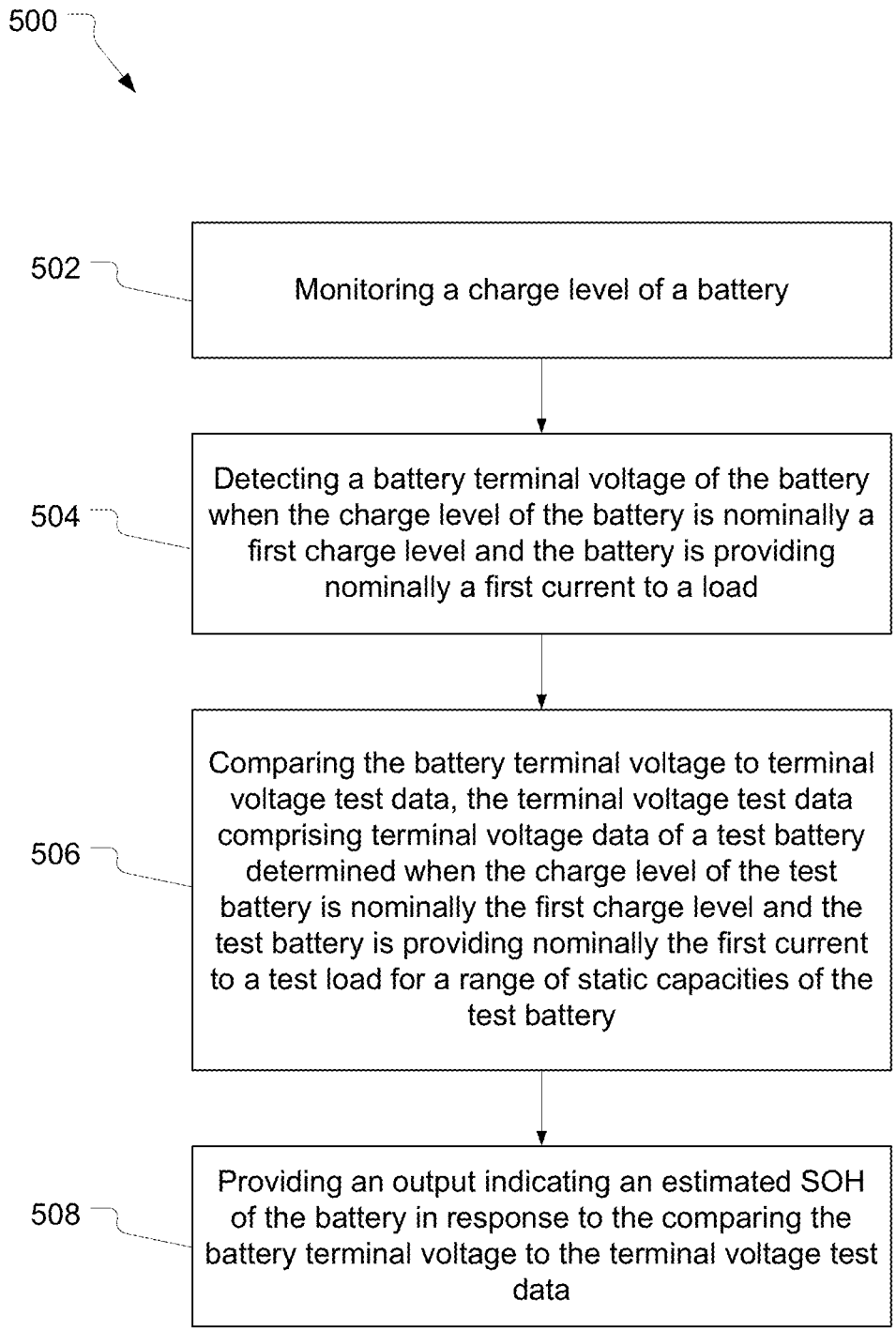
FIG. 5 is a flow chart illustrating operations according to a method consistent with the present disclosure.

Although FIGS. 1-4 illustrate terminal voltage test data derived from lithium-ion battery samples, a systems and methods consistent with the present disclosure are not limited to operation in connection with lithium-ion batteries. Any battery type that exhibits a correlation between battery terminal voltage and static capacity, as described in connection with FIGS. 1-4, may be used in a system and method consistent with the present disclosure by tabulating and storing terminal voltage test data and comparing battery terminal voltage to the terminal voltage test data to provide an estimate of battery SOH A system and method consistent with the present disclosure may thus be implemented in a variety of configurations. FIG. 5 is a flow chart illustrating one example of a method 500 consistent with the present disclosure. In the illustrated embodiment, operation 502 includes monitoring a charge level of a battery. In some embodiments, the battery may be a lithium-ion battery, but other battery types may be used. Also, monitoring the charge level in step 502 may be performed while charging and/or discharging the battery.

Operation 504 includes detecting a battery terminal voltage of the battery when the charge level of the battery is nominally a first charge level and the battery is providing nominally a first current to a load. Operation 506 includes comparing the battery terminal voltage to terminal voltage test data, the terminal voltage test data including terminal voltage data of a test battery determined when the charge level of the test battery is nominally the first charge level and the test battery is providing nominally the first current to a test load for a range of static capacities of the test battery. In some embodiments, detecting the battery terminal voltage in operation 504 may be performed when the battery is at nominally a first temperature, and the terminal voltage test data in operation 506 may be determined when the test battery is at nominally the first temperature. Operation 508 includes providing an output indicating an estimated SOH of the battery in response to the comparing the battery terminal voltage to the terminal voltage test data.

While FIG. 5 illustrates various operations according to an embodiment, it is to be understood that not all of the operations depicted in FIG. 5 are necessary for other embodiments. Indeed, it is fully contemplated herein that in other embodiments of the present disclosure, the operations depicted in FIG. 5, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

Figure 6:
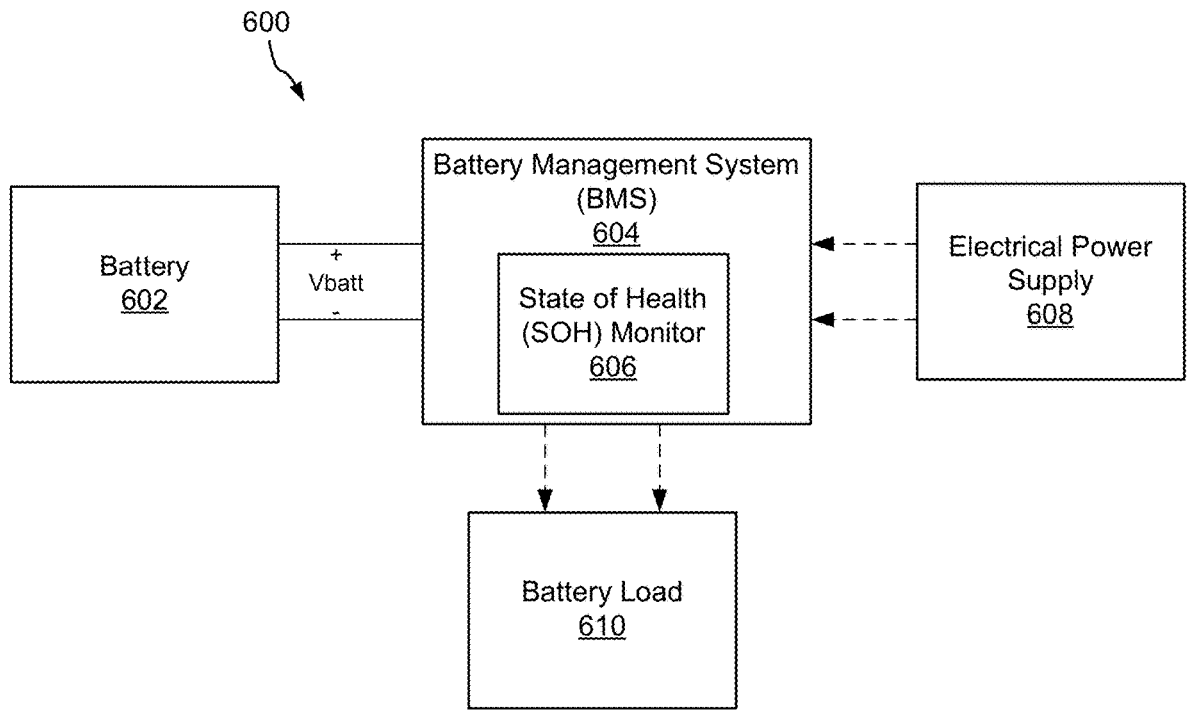
FIG. 6 is a simplified block diagram of one example of a system consistent with the present disclosure.

Turning now to FIG. 6, there is provided is a simplified block diagram of one example embodiment of a system 600 consistent with the present disclosure. In general, the system 100 may be configured to estimate the SOH of a battery by comparing measured battery terminal voltage Vbatt to terminal voltage test data in a manner consistent with the present disclosure. Those of ordinary skill in the art will recognize that the system 600 has been depicted in highly simplified form for ease of explanation. It is to be understood that a system and method consistent with the present disclosure may be incorporated into a wide variety of applications and configurations.

As shown, the system 600 includes a battery 602 and a battery management system (BMS) 604 including a SOH monitor 606. An electrical power supply 608, such as wall outlet providing line voltage (120 VAC), a battery source such as a vehicle battery, etc. may be coupled to the battery 602 through the BMS 604. A battery load 610, such as an electric vehicle drive system, a laptop computer, cell phone, a power tool, medical device, etc., may be coupled to the battery 602 through the BMS 604.

The battery 602 may be any battery type configured to drive the battery load 610 and may, for example, be a lithium-ion battery. Several different types of lithium-ion batteries are well-known, including lithium-ion batteries with cathodes comprising lithium cobalt oxide, lithium manganese oxide, lithium nickel manganese cobalt oxide, lithium iron phosphate, lithium nickel cobalt aluminum oxide, and lithium titanate.

The BMS 604 may include a variety of well-known components for managing the charging of the battery 602 by the electrical power supply 608 and/or discharging of the battery 602 through the battery load 610. The BMS 604 may also, or alternatively, be configured in a known manner to protect the battery 602 from operating outside its safe operating parameters, monitoring its state, calculating secondary data, reporting data such as the battery terminal voltage, the battery temperature, the battery state of charge, etc., controlling its environment, authenticating the battery 602 and/or balancing the battery 602.

The SOH monitor 606 provides an indication of battery SOH in response to comparing battery terminal voltage Vbatt to terminal voltage test data, as described herein. In the illustrated example, the SOH monitor 606 is shown as being incorporated within the BMS 604 and may receive data representative of the terminal voltage Vbatt of the battery 602 from the BMS 604. It is to is to be understood, however, that a SOH monitor 606 consistent with the present disclosure, or any portion or portions thereof, may be provided as a separate component from the BMS 604 and/or may separately determine the terminal voltage Vbatt, e.g. using a separate detector, for purposes of providing an indication of the battery SOH in a manner consistent with the present disclosure.

Figure 7:
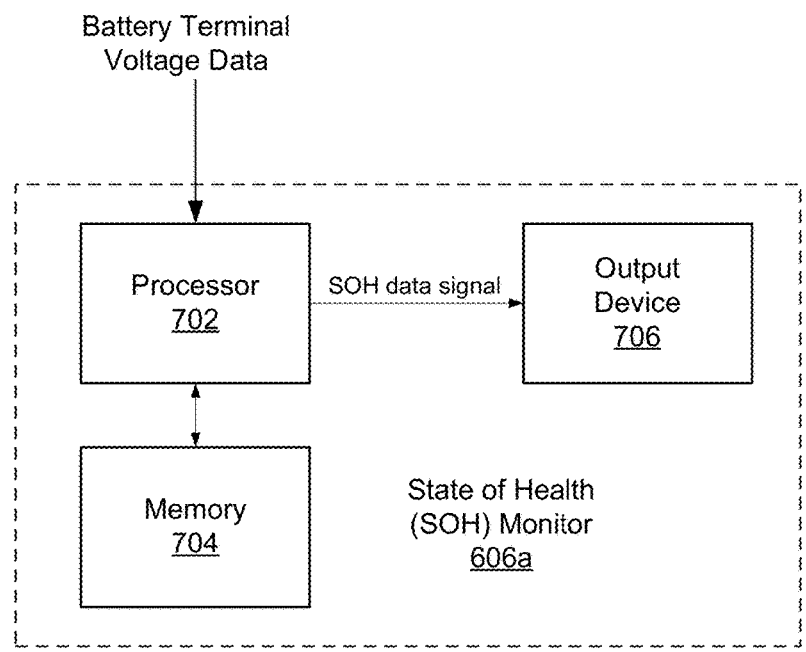
FIG. 7 is a simplified block diagram of one example of a state of health monitor system consistent with the present disclosure.

The SOH monitor 606 may thus be provided in a variety of configurations. FIG. 7 is a simplified block diagram of one example embodiment 606*a* of a SOH monitor consistent with the present disclosure. The illustrated example embodiment 606*a* includes a processor 702, a non-transitory computer readable memory 704 and an output device 706. The processor 702 may be any known processor for receiving battery terminal voltage data representative of the terminal voltage, e.g. Vbatt, from a battery 602 and comparing battery terminal voltage data to terminal voltage test data, as described herein. The terminal voltage test data may be stored, e.g. as a look-up table, in memory 704. When used in a battery charging mode, a monitored battery charge level and battery terminal voltage data may also be stored in the memory for comparison to the terminal voltage data, as described herein. The processor 702 may be coupled for storing and retrieving data, including the terminal voltage test data, from the memory 704, and may be configured to provide a SOH data signal to the output device 706. The output device 706 may be a display and/or other visual and/or audio device configured to provide an indication of the battery SOH representative of and in response to the SOH data signal.

According to one aspect of the disclosure there is thus provided a method of providing an estimate of the state of health (SOH) of a battery, the method including: monitoring a charge level of the battery; detecting a battery terminal voltage of the battery when the charge level of the battery is nominally a first charge level and the battery is providing nominally a first current to a load; comparing the battery terminal voltage to terminal voltage test data, the terminal voltage test data including terminal voltage data of a test battery determined when the charge level of the test battery is nominally the first charge level and the test battery is providing nominally the first current to a test load for a range of static capacities of the test battery; and providing an output indicating an estimated SOH of the battery in response to the comparing the battery terminal voltage to the terminal voltage test data.

According to another aspect of the disclosure there is provided a method of providing an estimate of the state of health (SOH) of a battery, the method including: monitoring a charge level of the battery, wherein the battery is a lithium-ion battery; detecting a battery terminal voltage of the battery when the charge level of the battery is nominally a first charge level and the battery is providing nominally a first current to a load and the battery is at nominally a first temperature; comparing the battery terminal voltage to terminal voltage test data, the terminal voltage test data including terminal voltage data of a test battery determined when the charge level of the test battery is nominally the first charge level and the test battery is providing nominally the first current to a test load and the test battery is at nominally the first temperature for a range of static capacities of the test battery; and providing an output indicating an estimated SOH of the battery in response to the comparing the battery terminal voltage to the terminal voltage test data.

According to another aspect of the disclosure there is provided a state of health (SOH) monitor system for providing an indication of an estimated of the state of health (SOH) of a battery. The system includes a non-transitory computer readable memory having terminal voltage test data stored thereon the terminal voltage test data including terminal voltage data of a test battery determined when the charge level of the test battery is nominally a first charge level and the test battery is providing nominally a first current to a test load for a range of static capacities of the test battery. The system also includes a processor configured to receive battery terminal voltage data representative of a terminal voltage of the battery when the charge level of the battery is nominally the first charge level and the battery is providing nominally the first current to a load, the processor being further configured provide an SOH data signal output indicating an estimated SOH of the battery in response to the comparing the battery terminal voltage data to the terminal voltage test data; and an output device configured to provide the indication of the estimated state of health in response to the SOH data signal output.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

Embodiments of the methods described herein may be implemented using a controller, processor and/or other programmable device. To that end, the methods described herein may be implemented on a tangible, non-transitory computer readable medium having instructions stored thereon that when executed by one or more processors perform the methods. Thus, for example, the memory 704 may store instructions (in, for example, firmware or software) to perform the operations described herein. The storage medium, e.g. the memory 704, may include any type of tangible medium, for example, any type of disk optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

It will be appreciated by those skilled in the art that any block diagrams herein represent conceptual views of illustrative circuitry embodying the principles of the disclosure. Similarly, it will be appreciated that any block diagrams, flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The functions of the various elements shown in the figures, including any functional blocks labeled as "processor", such as processor 702, may be provided through the use of dedicated hardware as well as hardware capable of executing software in association with appropriate software. The functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals.

As used herein, use of the term "nominal" or "nominally" when referring to an amount means a designated or theoretical amount that may vary from the actual amount.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems. Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Although the methods and systems have been described relative to a specific embodiment thereof, they are not so limited. Obviously, many modifications and variations may become apparent in light of the above teachings. Many additional changes in the details, materials, and arrangement of parts, herein described and illustrated, may be made by those skilled in the art.

What is claimed is:

1. A method of providing an estimate of the state of health (SOH) of a battery, the method comprising:
   monitoring a charge level of the battery;
   detecting a battery terminal voltage of the battery when the charge level of the battery is nominally a first charge level and the battery is providing nominally a first current to a load;
   comparing the battery terminal voltage to terminal voltage test data, the terminal voltage test data comprising terminal voltage data of a test battery determined when the charge level of the test battery is nominally the first charge level and the test battery is providing nominally the first current to a test load for a range of static capacities of the test battery, wherein the terminal voltage test data being generated, at least in part, using calendar test data in which the test battery is tested for state-of-charge (SOC) measurements at a plurality of temperatures, the test battery is then placed into storage and removed from storage after a predetermined time frame, and the terminal voltage test data is determined after removal from storage of the test battery; and providing an output indicating an estimated SOH of the battery in response to the comparing the battery terminal voltage to the terminal voltage test data.

2. A method according to claim 1,
wherein the detecting the battery terminal voltage of the battery comprises detecting the battery terminal voltage when the battery is at nominally a first temperature, and
the terminal voltage test data is determined when the test battery is at nominally the first temperature.

3. A method according to claim 1, wherein the monitoring a charge level of the battery is performed while discharging the battery.

4. A method according to claim 3, the method further comprising monitoring a load current to the load to determine when the load current is nominally the first current.

5. A method according to claim 1, wherein the monitoring a charge level of the battery is performed while charging the battery.

6. A method according to claim 1, wherein the first charge is nominally fifty percent of a beginning-of-life static capacity of the battery.

7. A method according to claim 1, wherein the first charge is nominally eighty percent of a beginning-of-life static capacity of the battery.

8. A method according to claim 1, wherein the battery is a lithium-ion battery.

9. A method of providing an estimate of the state of health (SOH) of a battery, the method comprising:
monitoring a charge level of the battery, wherein the battery is a lithium-ion battery;
detecting a battery terminal voltage of the battery when the charge level of the battery is nominally a first charge level and the battery is providing nominally a first current to a load and the battery is at nominally a first temperature;
comparing the battery terminal voltage to terminal voltage test data, the terminal voltage test data comprising terminal voltage data of a test battery determined when the charge level of the test battery is nominally the first charge level and the test battery is providing nominally the first current to a test load and the test battery is at nominally the first temperature for a range of static capacities of the test battery, wherein the terminal voltage test data being generated, at least in part, using calendar test data in which the test battery is tested for state-of-charge (SOC) measurements at a plurality of temperatures, the test battery is then placed into storage and removed from storage after a predetermined time frame, and the terminal voltage test data is determined after removal from storage of the test battery; and
providing an output indicating an estimated SOH of the battery in response to the comparing the battery terminal voltage to the terminal voltage test data.

10. A method according to claim 9, wherein the monitoring a charge level of the battery is performed while discharging the battery.

11. A method according to claim 10, the method further comprising monitoring a load current to the load to determine when the load current is nominally the first current.

12. A method according to claim 9, wherein the monitoring a charge level of the battery is performed while charging the battery.

13. A method according to claim 9, wherein the first charge is nominally fifty percent of a beginning-of-life static capacity of the battery.

14. A method according to claim 9, wherein the first charge is nominally eighty percent of a beginning-of-life static capacity of the battery.

15. A state of health (SOH) monitor system for providing an indication of an estimated of the state of health (SOH) of a battery, the system comprising:
a non-transitory computer readable memory having terminal voltage test data stored thereon the terminal voltage test data comprising terminal voltage data of a test battery determined when the charge level of the test battery is nominally a first charge level and the test battery is providing nominally a first current to a test load for a range of static capacities of the test battery wherein the terminal voltage test data being generated, at least in part, using calendar test data in which the test battery is tested for state-of-charge (SOC) measurements at a plurality of temperatures, the test battery is then placed into storage and removed from storage after a predetermined time frame, and the terminal voltage test data is determined after removal from storage of the test battery;
a processor configured to receive battery terminal voltage data representative of a terminal voltage of the battery when the charge level of the battery is nominally the first charge level and the battery is providing nominally the first current to a load, the processor being further configured provide a SOH data signal output indicating an estimated SOH of the battery in response to the comparing the battery terminal voltage data to the terminal voltage test data; and
an output device configured to provide the indication of the estimated state of health in response to the SOH data signal output.

16. A system according to claim 15,
wherein the battery terminal voltage data is representative of the terminal voltage when the battery is at nominally a first temperature, and
the terminal voltage test data is determined when the test battery is at nominally the first temperature.

17. A system according to claim 15, wherein the first charge is nominally fifty percent of a beginning-of-life static capacity of the battery.

18. A system according to claim 15, wherein the first charge is nominally eighty percent of a beginning-of-life static capacity of the battery.

19. A system according to claim 15, wherein the battery is a lithium-ion battery.

* * * * *